US006222370B1

(12) United States Patent
Schousek et al.

(10) Patent No.: US 6,222,370 B1
(45) Date of Patent: Apr. 24, 2001

(54) UNIVERSAL BATTERY MONITOR

(76) Inventors: Brian Walter Schousek; Theresa Jean Schousek, both of 1409 County Road V, Houlton, WI (US) 54082

( * ) Notice: Subject to any disclaimer, the term of this patent is extended or adjusted under 35 U.S.C. 154(b) by 0 days.

(21) Appl. No.: 09/267,040

(22) Filed: Mar. 13, 1999

Related U.S. Application Data

(60) Provisional application No. 60/077,964, filed on Mar. 13, 1998.

(51) Int. Cl.$^7$ .................................................. G01N 27/416
(52) U.S. Cl. ............................................. 324/436; 320/136
(58) Field of Search .................................. 324/436, 433, 324/430, 427; 320/136, 161, 134; 429/90, 91, 92

(56) References Cited

U.S. PATENT DOCUMENTS

| | | | |
|---|---|---|---|
| 3,753,094 | 8/1973 | Furuishi | 324/430 |
| 3,873,911 | 3/1975 | Champlin | 324/430 |
| 3,909,708 | 9/1975 | Champlin | 324/431 |
| 4,825,170 | 4/1989 | Champlin | 324/436 |
| 5,451,881 | * 9/1995 | Finger | 324/433 |
| 5,550,475 | * 8/1996 | Shafer | 324/433 |
| 5,574,355 | * 11/1996 | McShane et al. | 320/161 |
| 5,876,870 | * 3/1999 | Kawabata | 324/433 |

* cited by examiner

*Primary Examiner*—Peter S. Wong
*Assistant Examiner*—Lawrence Luk
(74) *Attorney, Agent, or Firm*—Reidlaw, L.L.C.; John S. Reid

(57) ABSTRACT

The invention includes a direct current energy source monitor which automatically detects the nominal voltage of the direct current energy source to which it is attached. The invention further includes a direct current energy source monitor which is self-powered from the direct current energy source being monitored. The multiple nominal voltage direct current energy source monitor includes an analog-to-digital converter configured to measure voltage from a direct current energy source being monitored and generate a digital output corresponding thereto. The apparatus includes a programmable control device configured to receive the digital output from the analog-to-digital converter and to look up a nominal voltage corresponding to the digital output, and is further configured to calculate a relative charge of the direct current energy source as compared to a full charge on the direct current energy source. The direct current energy source monitor can include a voltage controlled oscillator configured to receive the voltage of the direct current energy source being monitored and generate a frequency output proportional to the received voltage. The programmable control device is configured use the frequency output to determine the received voltage from the direct current energy source. The direct current energy source monitor preferably includes a calibration circuit configured to periodically calibrate the voltage controlled oscillator. The calibration circuit is configured to generate known voltages which are supplied to the voltage controlled oscillator. The voltage controlled oscillator is governed by a transfer function, wherein its output is a function of the input. The coefficients of the transfer function are calculated by the programmable control device based on the known voltages applied to the voltage controlled oscillator and the output produced by the voltage controlled oscillator in response thereto.

27 Claims, 10 Drawing Sheets

UNIVERSAL BATTERY MONITOR

Related Cases

This application claims priority to Provisional Patent Application Ser. No. 60/077,964, filed Mar. 13, 1998, and which is incorporated herein by reference.

FIELD OF THE INVENTION

This invention pertains to energy source monitors, and in particular to a direct current energy source monitor capable of use with a plurality of different DC energy sources, such as batteries, wherein the energy sources have different nominal voltages from one another.

BACKGROUND

Direct current (DC) energy sources, such as batteries, are used in many situations where constant alternating current (AC) power is not available. Examples include auxiliary power for vehicles such as semi trucks, automobiles, ambulances, motorcycles, recreational vehicles, boats, and standby generators. Examples further include primary power for forklifts, trolling motors, golf carts, pallet trucks, floor scrubbers, wheel chairs, electric vehicles, and scissor lifts. The primary DC energy source used in such applications is a lead acid battery, typically ranging in nominal voltage from 6 to 48 volts.

In many applications, it is desirable or even critical to monitor the charge level of the energy source so that the user has an indication when the energy source is getting low on voltage or is deviating from a desired voltage range, and needs to be recharged or replaced. The voltage level on the energy source is a measurable indicator of charge of the energy source, and can be monitored with a device commonly known as a "monitor" or a "battery monitor" where the source is a battery. Without a monitor, typically the only inherent indication that a user has that the energy source is in a charged state is whether or not it activates the equipment to which it is attached. Many prior art devices exist which measure the voltage level on a battery or other DC energy source and display the charge level through some means (e.g., bar graph, digit readout, mechanical meter) but these devices generally work only for a particular nominal energy source voltage. That is, a prior art 12 volt DC source monitor will not properly monitor, or even work on, a nominal 24 volt energy source. Further, prior art DC monitors often require supplemental power besides the source being monitored in order to operate. The ability for a prior art monitor to work for a plurality of nominal source voltages generally requires some user interaction, for example, turning a knob to select a voltage, reading a printed conversion table, etc. A normal prior art single-voltage DC energy source monitor is typically constructed of a circuit which essentially is a set of voltage level comparators, with the thresholds for the comparators tied to some reference voltage and the output tied to a display device such as a light emitting diode (LED). This solution is impractical for a multiple-voltage DC monitor because with each type of DC source a complete set of comparators and associated reference thresholds must be included which eventually lead to a large, expensive circuit.

In many applications, it is desirable to monitor the direct current (DC) energy source capacity, aging characteristics, or capability of instantaneous current supply, commonly known as the DC energy sources' "condition" or "state-of-health." The conductance of a battery is a measurable indicator of the "state-of-health", and can be tested and/or monitored with a device commonly known as a "battery monitor."

It is thus desirable that a DC energy source voltage monitor be provided which has the capability to automatically determine nominal voltages of the batteries intended for monitoring by the device, and which is relatively simple to manufacture. In addition, it is desirable to be able to monitor the state of health or battery condition, which can be indicated by conductance of the DC source.

SUMMARY OF THE INVENTION

The invention includes a DC energy source monitor (which will be known simply as a "monitor" herein for the sake of simplicity), such as a battery monitor, which automatically detects the nominal voltage of the DC energy source to which it is attached. It is understood that when the expression "battery monitor" is used herein with reference to the invention, that it includes more broadly a monitor for monitoring any source of direct current energy, and should not be considered as limited to a battery unless expressly stated as being so limited. The invention further includes a monitor which is self-powered from the DC source being monitored. In a first embodiment of the invention, a multiple nominal voltage monitor comprises an analog-to-digital converter configured to measure voltage from a DC source being monitored by the voltage monitor and generate a digital output corresponding thereto. The embodiment further includes a programmable control device configured to receive the digital output from the analog-to-digital converter and to look up a nominal voltage corresponding to digital output, and further configured to calculate a relative charge of the DC source as compared to a full charge from the nominal DC source. The first embodiment of the invention can further include a display in communication with the programmable control device and configured to display the nominal DC source voltage and the relative charge of the DC source as compared to a fully charged nominal source.

A second embodiment of the invention comprises the components of the first embodiment, and further comprises a voltage controlled oscillator configured to receive the voltage of the DC source being monitored and generate a frequency output proportional to the received voltage. The programmable control device is configured use the frequency output to determine the received voltage from the DC source.

In yet a third embodiment of the invention, a multiple nominal voltage DC energy source voltage monitor comprises the components of the first and second embodiments, and further comprises a calibration circuit configured to periodically calibrate the voltage controlled oscillator. The calibration circuit is configured to generate known voltages which are supplied to the voltage controlled oscillator. The voltage controlled oscillator is governed by a transfer function, wherein its output is a function of the input. The coefficients of the transfer function are calculated by the programmable control device based on the known voltages applied to the voltage controlled oscillator and the output produced by the voltage controlled oscillator in response thereto.

The invention further comprises a DC energy source voltage monitor which is powered by a power supply which is powered by the DC source being monitored. The power supply comprises a series voltage regulator utilizing a voltage reference with a power pass transistor.

The invention can further include a multiple nominal voltage direct current energy source monitor for monitoring the state of health of the energy source, including conductance, age, capability of the source to provide current, and charge capacity of the source.

DESCRIPTION OF PREFERRED EMBODIMENTS OF THE INVENTION

Figure 1:
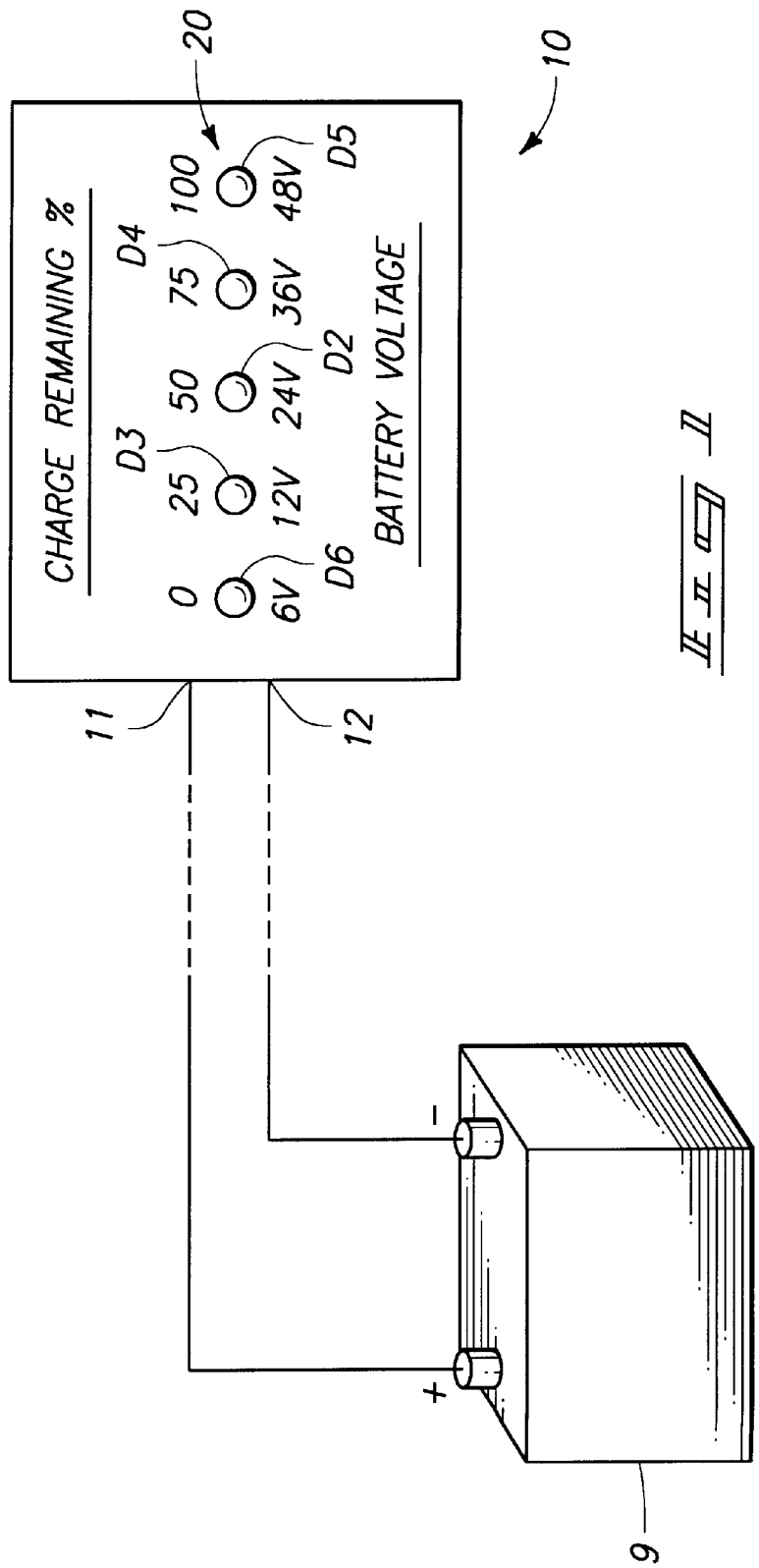
FIG. 1 is an environmental view showing a DC energy source monitor of the present invention connected to a direct current energy source.

The present invention pertains to a direct current (DC) energy source monitor. A typical example of a DC energy source is a battery. It is understood that the present invention pertains to the broader category of DC energy sources, even if reference is made to a "battery". The present invention will be described herein simply as a "monitor", a "source monitor", a "DC source monitor", a "DC energy source monitor", a "direct current energy source monitor", or a "battery monitor", in all cases referring to the same thing. Likewise, the source being monitored will be referred to alternately as a "direct current energy source", a "DC energy source", a "DC source", a "source", or a "battery", in all cases referring to the a direct current energy source, unless expressly limited to a particular type of direct current energy source. Examples of DC sources include a single battery cell, a bank of batteries, a set of batteries in series, or a DC source converted from an alternating current (AC) source.

While the present invention pertains to a monitor for monitoring voltage of a source. it also pertains to a monitor for monitoring the state of health, or present condition, of the source. Examples of state-of-health of a DC source, such as a battery, include the conductance of the source, the age of the source, the charge capacity of the source, and the capability of the source to provide instantaneous current supply. Thus, while the monitor may be referred to herein from time to time as a "voltage monitor", it is understood that the monitor can also comprise a state-of-health DC energy source monitor.

The monitor of the present invention can be used to monitor a loaded or an unloaded source. Further, the present invention can be used either as a continuous monitor, or as an intermittent monitor or tester. The expression "monitor" should be understood as encompassing both continuous and intermittent monitors.

In a first embodiment of the invention, the input from the DC source being monitored is measured directly with an analog-to-digital converter (ADC) to produce a converted, digital signal. The converted digital signal is then provided to a microcontroller (uC) which is configured with a look-up table to determine the nominal voltage of the source to which the monitor is attached. The microcontroller can then be programmed to select the corresponding nominal voltage, and to activate appropriate, known, circuitry for monitoring a source of the indicated nominal voltage. The indicated voltage can be further displayed to the user, in addition to displaying the actual, monitored voltage level of the source. The first embodiment is based on the principle that most DC energy sources, such as lead-acid batteries, are constructed such that their charge levels do not overlap. For example, the voltage of a nominal 24 volt battery, even at its most discharged state, is generally greater than the voltage of a highly charged 12 volt battery. It is therefore possible to distinguish between 6, 12, 24, 36 and 48 volt batteries or sources and select their charge levels with a software lookup table. This first embodiment will be known as the "Microcontroller Based Analog to Digital Converter Embodiment" or "ADC Embodiment" for reference purposes herein only.

A second embodiment, which will be referred to herein for reference purposes only as the "Microcontroller Based Voltage Controlled Oscillator Embodiment" or "VCO Embodiment", improves on the resolution of the ADC Embodiment. In order to repeatedly measure, for example, the difference between a discharged and 25% charged 12 volt DC source, the ADC Embodiment is preferably configured to distinguish levels of 120 millivolts. The ADC Embodiment is also preferably configured to be able to operate over sufficient range to allow for a fully charged 48 volt DC source (for example, four batteries at 12.63 volts per battery placed in series for a total voltage of 50.52V). Assuming the complete range of operation to be 40 volts, the ADC Embodiment is preferably configured to have a minimum resolution of 40 volts divided by 0.120 volts per count, or 333 counts for full scale. This is slightly more than a typical 8-bit ADC can accomplish, and in practice more bits of resolution are desirable to provide noise immunity. ADCs greater than 8 bits are available, but provide complexity to the ADC Embodiment.

In the second embodiment, the VCO Embodiment, the input voltage from the DC source being monitored is first converted into a frequency using a voltage controlled oscillator ("VCO"), and then a microcontroller is used to measure the frequency produced by the VCO. The microcontroller is configured to make a determination of what type of DC source (nominal voltage) is attached to the monitor based on the measured frequency. The microcontroller can then be configured to set the output display accordingly, and to activate other known circuitry for monitoring the DC source voltage. The voltage-to-frequency conversion performed in the second embodiment improves on the accuracy of the ADC embodiment. In the VCO embodiment, the frequency generated is preferably repeatable for the voltage levels of interest. This can be accomplished by using high precision components within the circuitry of the VCO Embodiment of the monitor.

A third embodiment of the present invention obtains the accuracy of the second embodiment, without the use of precision circuit components in the voltage control oscillator. This third embodiment, which is the preferred embodiment of the present invention, will also be referred to herein, for reference purposes only, as the "Microcontroller Based VCO Implementation with Self-Calibration Embodiment".

Using high precision components in the VCO in the second embodiment provides for an accurate circuit output. If high precision components are not used in the VCO, then the output thereof can deteriorate. In order to avoid using high precision components in the VCO, a method and apparatus for calibrating the VCO is provided. In a first variation, the apparatus for calibrating the VCO is accomplished by the addition of variable resistors in the VCO. The variable resistors are adjusted using known circuit design methods until the variation in the output of the VCO is nullified. In a second, preferred variation on the third embodiment, a microcontroller is used to calibrate the VCO. Since the second embodiment preferably incorporates a microcontroller in the system to distinguish the voltage levels, the microcontroller (MC) can also be used to provide self-calibration of the VCO. The VCO of the third embodiment provides for a very linear output from the VCO, and aids in the self-calibration effort.

The Apparatus

Turning to FIG. 1, an environmental view of an apparatus of the present invention is shown. A DC energy source monitor 10, constructed in accordance with the present invention, monitors the voltage of a DC energy source, here shown as a battery 9. The voltage monitor 10 has a first contact 11 connected to the positive terminal of the source, and a second contact 12 connected to the negative lead of the DC source. The monitor 10 has 5 light emitting diodes (LEDs) 20 which are used to display the nominal voltage of the source being monitored, as well as the relative charge on the source as compared to a "full" charge from a nominal source of the same type.

Apparatus Overview

Figure 8:
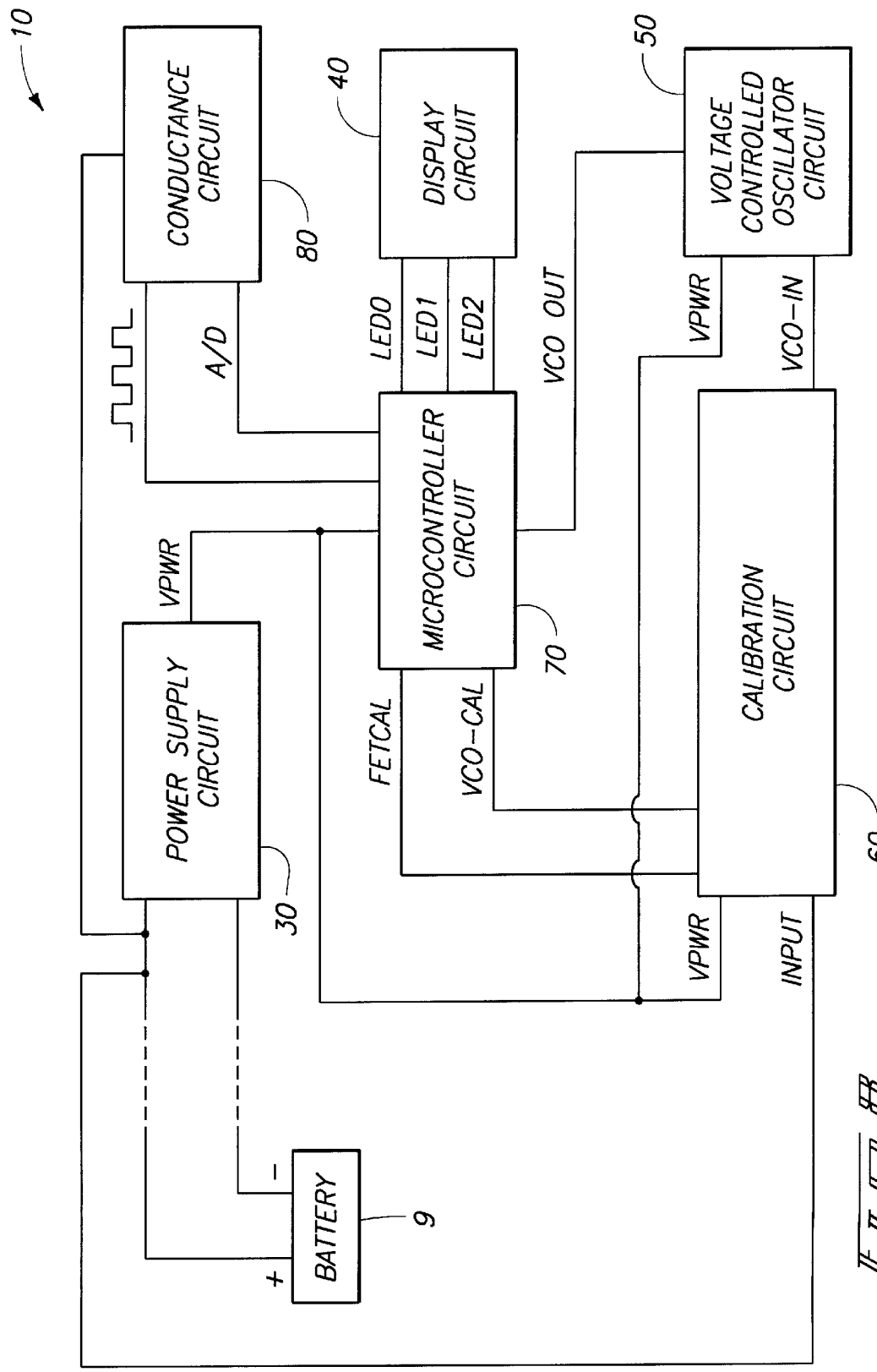
FIG. 8 is a block diagram showing the interaction of the circuit diagrams of FIGS. 2 through 6.

A schematic block diagram of one implementation of the third embodiment of the present invention is shown in FIG. 8. FIG. 8 shows the various components which make up this particular implementation. The monitor 10 includes a power supply circuit 30. The power supply circuit 30 is configured to convert power from the DC source being monitored, such as battery 9, into power used by the monitor itself. This results in a "self powered" voltage monitor, not requiring auxiliary power. The monitor 10 further includes a display circuit 40 for displaying the remaining charge on the battery, as well as displaying the nominal voltage of the battery being monitored.

The DC source monitor 10 of FIG. 8 includes a voltage controlled oscillator (VCO) circuit 50 for providing a digital signal to a microcontroller 70, which then determines the nominal voltage of the source being monitored based on the frequency of the digital output from the VCO circuit 50. The monitor 10 also preferably includes the calibration circuit 60 which calibrates the VCO circuit 50. The output VCO OUT from the VCO circuit 50 is provided to the microcontroller 70, which then provides a calibration signal VCO-CAL to the calibration circuit 60. Based on the calibration signal, the calibration circuit calibrates the VCO circuit 50 with a calibrated signal VCO-IN.

The apparatus can further include the conductance module 80 for monitoring the state of health or condition of the DC source.

The circuit components will be more fully described below.

Power Supply

Figure 2:
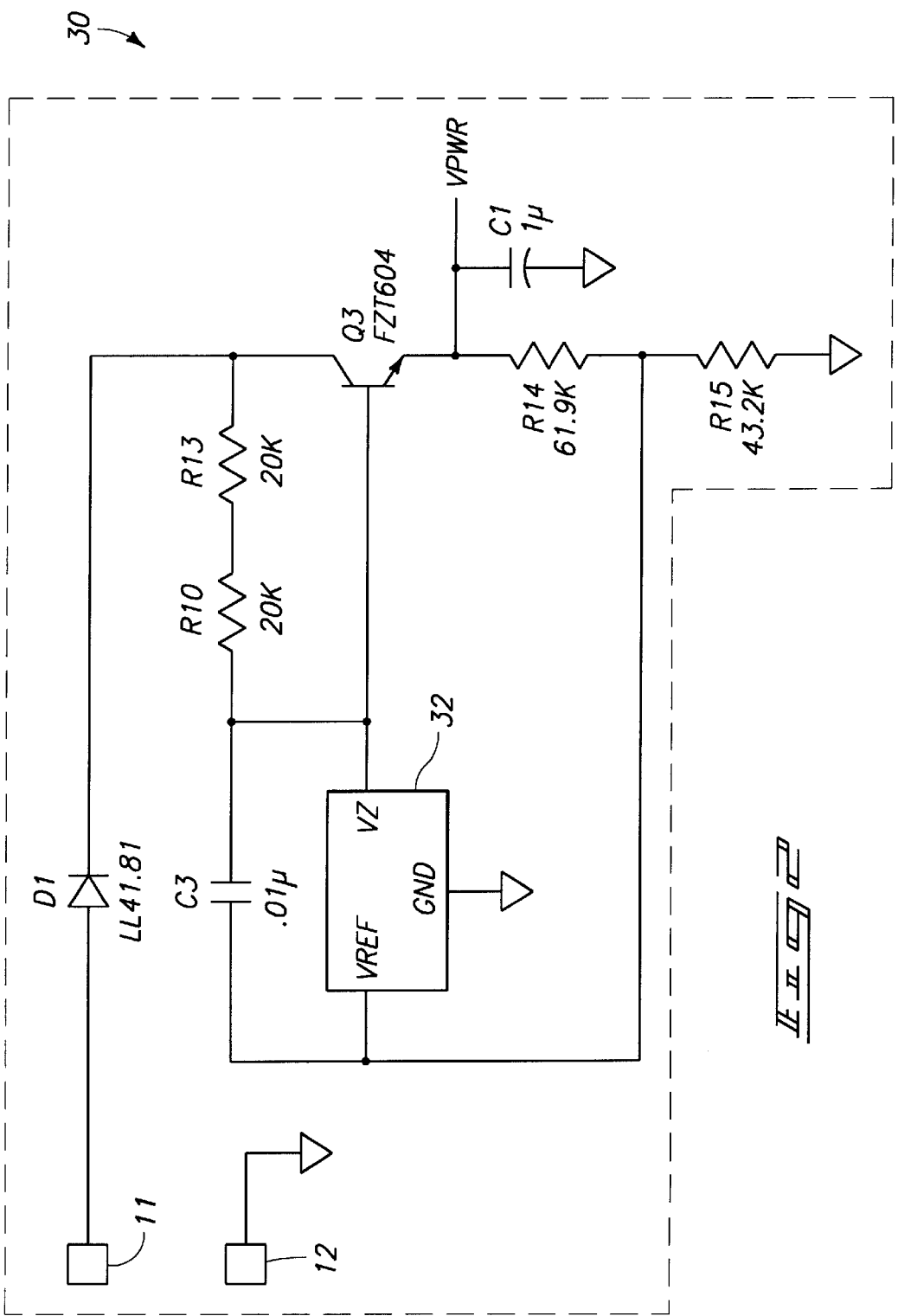
FIG. 2 is a schematic circuit diagram showing a power circuit which can be used in the present invention.

Turning to FIG. 2, one example of a power supply circuit 30 which can be used for a battery monitor of the present invention is shown. The power supply circuit is connected to the source being monitored at contacts 11 and 12, as shown in FIG. 1. The output from the power supply circuit is VPWR. The power supply circuit comprises a series voltage regulator utilizing a voltage reference 32 with a power pass transistor Q3. In one example the voltage reference 32 used is a standard ZR431 voltage reference.

The operation of the power supply circuit 30 is similar to that described further herein for the calibration circuit 60, with the exception that the voltage reference 32 in the power supply circuit 30 controls the base of the transistor Q3 to the source current rather than shunting current away from a higher level of source current. Since the input voltage from the source being monitored can be as high as 50 volts in certain instances, with a desired output voltage of 3V from the power supply circuit 30 and maximum current of 20 mA, the power dissipated in the pass transistor Q3 can be as high as 1.5 watts. This figure can be used to select the remaining components for the circuit. Typically however, the current from the power supply circuit 30 is less than 20 mA.

The specific power supply circuit 30 shown in FIG. 2 is an exemplary power circuit for a voltage monitor designed to monitor DC energy sources having nominal voltages of 6 to 48 volts. Further, the specific power supply circuit 20 shown in FIG. 2 is designed to provide a power of 3V to the rest of the monitor. Accordingly, the additional components of the power circuit 30 shown in FIG. 2, including resistors R10, R13, R14, and R15, capacitors C1 and C3, and diode D1, are shown with exemplary design values for the particular example of power supply circuit described. For DC voltage monitors designed to monitor a different range of nominal voltages, or to provide a different voltage to the other circuits of the monitor, the values for these components can be selected using known circuit design techniques.

Display

Figure 3:
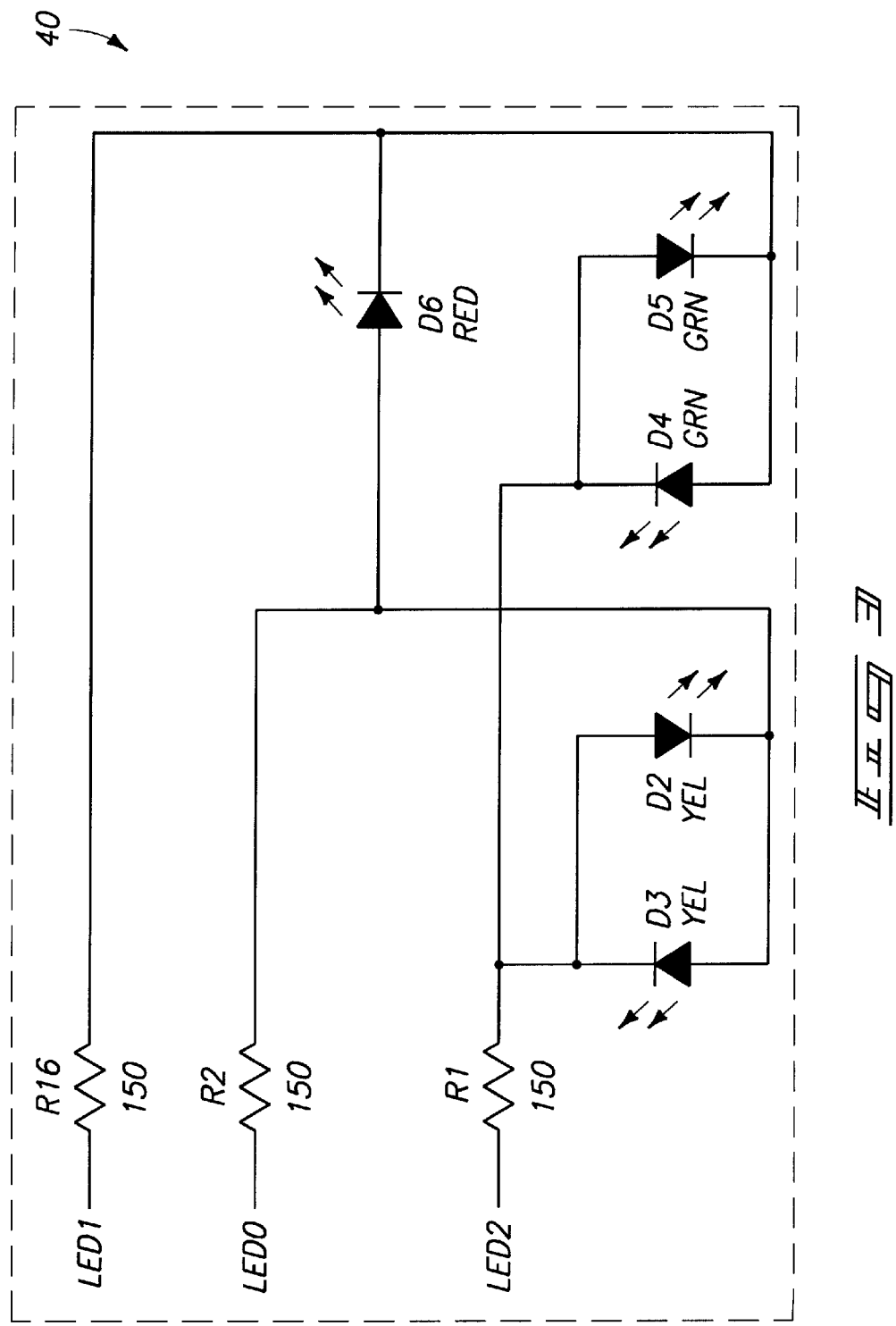
FIG. 3 is a schematic circuit diagram showing a display circuit which can be used in the present invention.

Turning to FIG. 3, an exemplary circuit diagram of a display circuit 40 which can be used in the present invention is shown. The particular display circuit shown uses LEDs to display the output. It is understood than an LCD display, or a meter or a digital readout can also be provided according to known techniques for displaying outputs from digital circuits. For example, an LCD display showing actual numerical values can be used in place of the LED indicator lights shown in the figure. The embodiment shown in FIG. 2 provides a relative simple, easy to implement, low power implementation.

The exemplary display circuit shown consists of five 5 LEDs, indicated as D6 (red), D3 (yellow 1), D2 (yellow 2), D4 (green 1), and D5 (green 2). The activation of the LEDs is driven by the microcontroller 72 of FIG. 6, as indicated in FIG. 8. In the example shown, the five LEDs indicate nominal relative source charge, as compared to a full charge on the nominal source, of 0%, 25%, 50%, 75% and 100%, as indicated in FIG. 1. For example, if the first yellow LED D3 were lit continuously, it would indicate a remaining battery life of 25% of full charge. In practice, the actual thresholds upon which the LEDs are activated can be configured to activate the LEDs at the midpoints between the levels of 0–25%, 25–50%, 50–75%, and 75–100%. In such instance a lit red LED D6 indicates less than 12.5% percent of full battery capacity, and green 2 (D4) indicates greater than 87.5% of full battery or source capacity.

In addition to a continuously lit LED indicating relative source charge, a blinking LED can indicate which DC source type (nominal voltage) is being monitored, as indicated in FIG. 1. The appropriate LED blinks when the unit powers on and any time a different DC energy source type is connected to the monitor. The LEDs shown in FIGS. 1 and 3 correspond to nominal voltages as follows: D6 (red) for 6V, D3 (yellow 1) for 12V, D2 (yellow 2) for 24V, D4 (green 1) for 36V, and D5 (green 2) for 48V. The activation of a blinking LED is controlled by the microcontroller 72 of FIG. 6 using known techniques for configuring a microcontroller to activate an LED in a continuous or blinking fashion upon receipt of a given digital input signal.

The values for resistors R16, R2 and R1 of FIG. 3 are exemplary for the particular implementation shown and described herein.

In one variation on the display circuit shown, the LEDs can be pulsed rather than turning them on by direct current, which can reduce current consumption within the display section 40 of the monitor 10.

Voltage Controlled Oscillator

Figure 4:
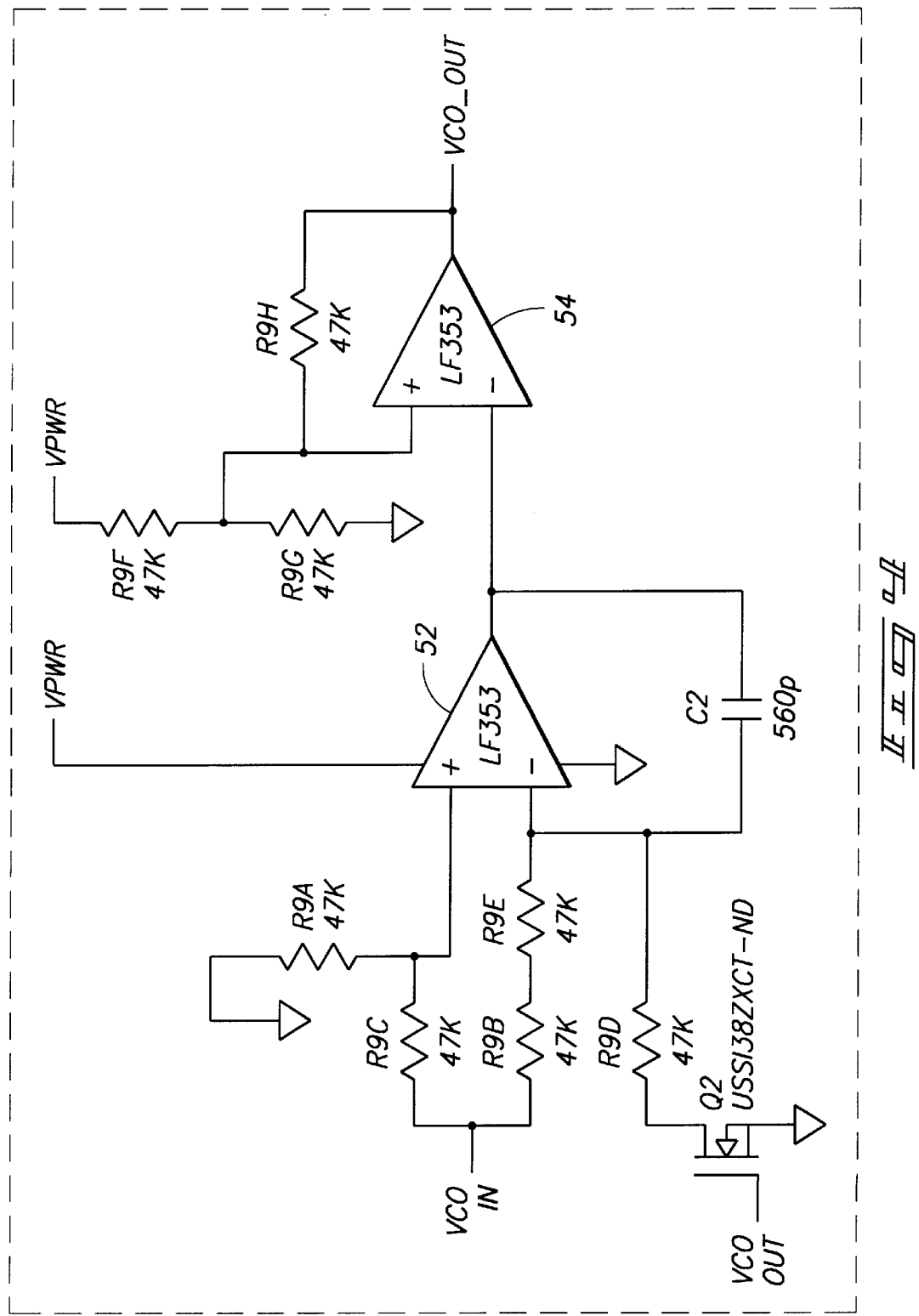
FIG. 4 is a schematic circuit diagram showing a voltage controlled oscillator circuit which can be used in the present invention.

Turning to FIG. 4, an exemplary voltage controlled oscillator (VCO) circuit 50 which can be used in the present invention is shown. The voltage controlled oscillator shown comprises of a dual op-amp (52 and 54) with a resistor array (R9A through R9H) forming feedback elements, a capacitor C2 for timing, and a MOSFET Q2 for changing the output polarity. The VCO section 50 shown in FIG. 4 is configured to produce a fixed 50% duty cycle regardless of the frequency generated. For the purposes of the VCO used in the specific embodiment of the monitor 10 described herein, it is assumed that the output of the VCO circuit 50 is linear and of the form y=m*x+b, where x is the input voltage VCO-IN, and y is the output frequency VCO-OUT. By using precision circuit components for the VCO circuit 50, the constants m and b can be held relatively constant.

However, where precision circuit components are not used for the VCO circuit 50, m and b are assumed to be stable over short time durations, but not over temperature and component variations. That is, if precision circuit components are not used for the VCO circuit 50, m and b can change from monitor to monitor and in a given monitor over temperature. To compensate for this variation, instead of relying on many precision components in the VCO circuitry 50, the third embodiment of the DC source monitor is configured to use a small number of precision components in a calibration circuit 60 (discussed more fully below) to calibrate the VCO using periodic in-line calibration to compensate for variations in the VCO circuit 50. The calibration circuit 60 can be used in conjunction with the microcontroller 72 to calculate values for m and b, as will be described more fully below.

As indicated in FIG. 8, the VCO circuit 50 receives power from the power supply circuit 30, a calibrated signal VCO-IN from the calibration circuit 60, and provides output VCO_OUT to the microcontroller 70. The output of the VCO circuit VCO_OUT is a digital signal indicative of the frequency (as counted by square waves generated by the VCO) generated by the VCO. The frequency generated by the VCO is dependent upon the load connected to the monitor, i.e., the voltage of the DC source being monitored. In the second embodiment of the invention wherein no calibration circuit 60 is used, the VCO receives as VCO-IN the input INPUT directly from the positive terminal of the source 9 (see FIG. 8), and circuit calibration 60 is removed.

The values and selection of the particular circuit components for the VCO circuit 50 shown in FIG. 4 are exemplary only.

VCO Calibration

Figure 5:
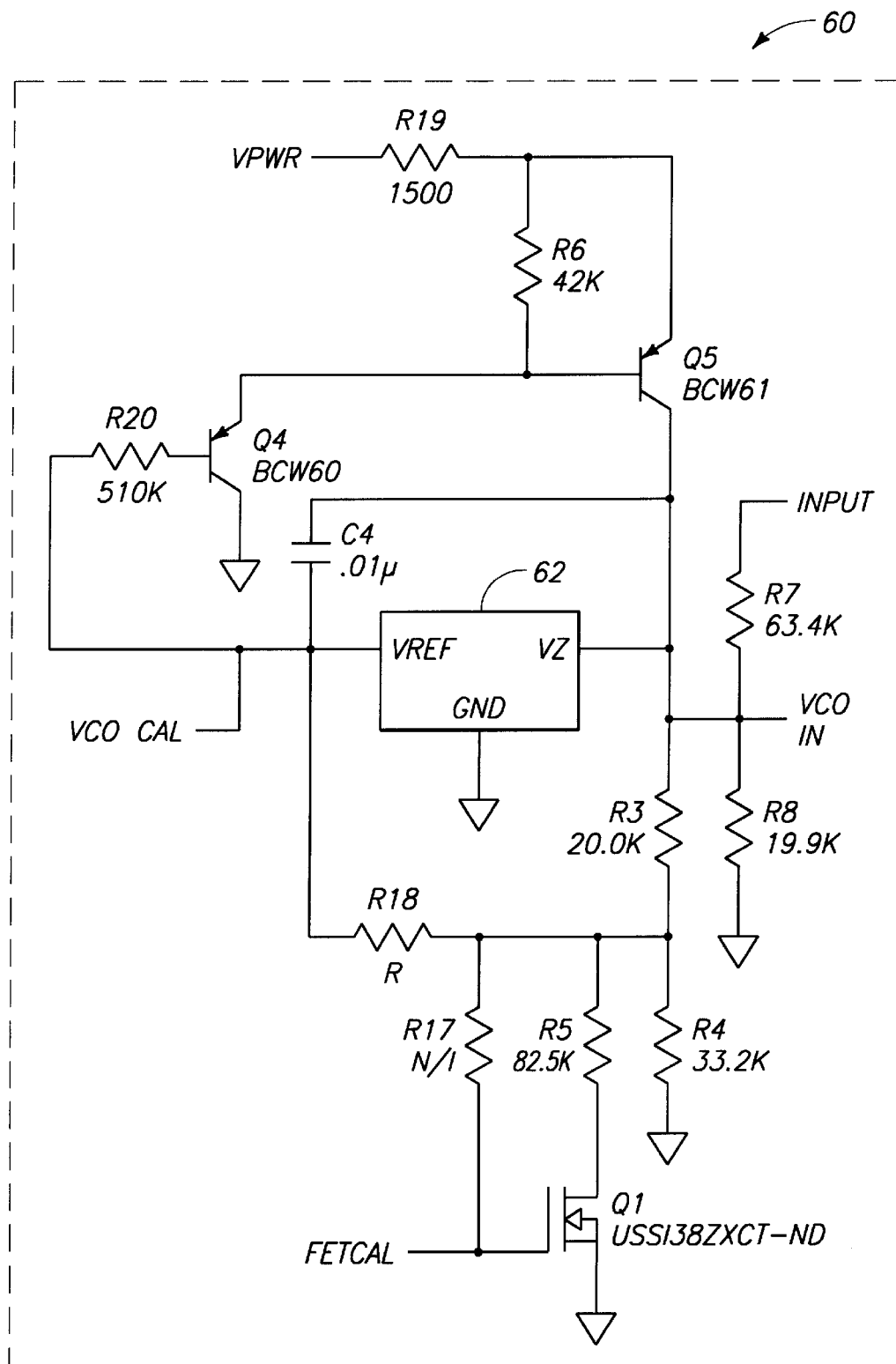
FIG. 5 is a schematic circuit diagram showing a calibration circuit which can be used in the present invention.

In the third embodiment or preferred of the invention, the monitor 10 is provided with a VCO calibration circuit 60 as shown in FIG. 8. A schematic circuit diagram of one implementation of the calibration circuit 60 is shown in FIG. 5. Turning now to FIG. 5, the VCO calibration circuit 60 receives as an input INPUT, the raw, unregulated voltage input from the positive terminal of the DC source 9 being monitored by the monitor 10, as shown in FIG. 8. The output VCO-IN of the calibration circuit 60 is the calibrated voltage provided to the VCO circuit 50, as indicated in FIG. 8. For a monitor configured to monitor DC sources such as batteries having nominal voltages of between 6V and 48V, and operating on a 3V power supply, the output voltage VCO-IN from the calibration circuit 60 preferably varies from approximately 0.88V to 7.7V.

The calibration circuit 60 includes a voltage reference 62, which is a ZR431 voltage reference in the example shown. The calibration circuit further includes MOSFET Q1 for establishing the output voltage VCO-IN of the calibration section 60, as described more fully below.

The inputs VCO_CAL, and FETCAL to the calibration circuit 60 are digital signals from the microcontroller 72 of the control section 70, as indicated in FIG. 8. When VCO_CAL, is at logic 0, the VREF pin of voltage reference 62 is held low, effectively removing the voltage reference 62 from the circuit and allowing resistors R7 and R8 to form a voltage divider to the VCO circuit 50 directly from the raw input voltage INPUT. When VCO_CAL is configured as an input (high-impedance), the voltage reference 62 is turned "on", and the input INPUT has no substantial effect on the voltage input to the VCO circuit 50. Further, when the voltage reference 62 is turned "on", one of two fixed calibration voltages is applied to the calibration circuit output VCO_IN. The calibration voltage output VCO-IN depends on the state of the signal FETCAL from the microcontroller 72, as will now be described.

When the voltage reference 62 is turned "on", it modifies its output VZ in order to maintain a fixed voltage at its VREF pin. In one example, the fixed voltage at VREF is maintained at 2.5V when the voltage reference 62 is turned "on". When the signal FETCAL from the microcontroller 72 is set to logical 0, the MOSFET Q1 of the calibration circuit 60 is turned "off", and no current flows through resistor R5. This causes resistors R3 and R4 to establish the output voltage VCO-IN from the calibration circuit 60. That is, when the voltage reference 62 is turned "on", a voltage of 2.5V is applied across resistor R4. The pin VREF of the voltage reference 62 then draws very low current so that essentially all of the current set up in resistor R4 up goes through resistor R3. The voltage at resistor R3 is therefore the sum of 2.5 Volts plus the voltage calculated from the formula V=IR, where I is the current in resistor R4, and R is the resistance of resistor R3. VZ will therefore be equal to 2.5+(R4/2.5)*R3.

When the signal FETCAL, from the microcontroller 72 is set to logical 1, the MOSFET Q1 of the calibration circuit 60 is turned "on", and the reference voltage VREF from the voltage reference 62 (which will be 2.5V in the example being discussed) is applied across the parallel combination of resistors R4 and R5. In this instance, the output voltage VZ of the voltage reference 62 is the sum of 2.5V plus the voltage calculated from the formula ((R4∥R5)/2.5)*R3. A small amount of current is used to turn on the transistor chain comprised of transistors Q4 and Q5. This transistor chain is configured to provide any current necessary to brine VCO_IN up above the desired calibration voltage so that the voltage reference 62 can perform properly.

In summary, the calibration circuit 60 is configured to supply three output voltages VCO-IN voltages to the VCO circuit 50: two fixed voltages and one which is directly variable with system input voltage INPUT. This is accomplished by using resistors R7 and R8 of FIG. 5 to divide the input voltage INPUT which is then provided to the VCO circuit 50, which in turn generates a frequency based on that voltage and feeds the generated frequency back to the microcontroller 72, as indicated in FIG. 8. The VCO circuit 50 input voltage VCO-IN is set to one of two fixed calibration voltages or a third voltage dependent on the input voltage software the microcontroller 72, as will be described further below. With these three points, the input voltage INPUT from the battery being monitored can be calculated with accuracy.

The values and selection of the particular circuit components for the VCO calibration circuit 60 shown in FIG. 5 are exemplary only. In one variation on the calibration circuit 60 shown in FIG. 5, the MOSFET Q1 can be eliminated by tying resistor R5 directly to the micro port (shown as resistor R17 in the diagram).

Control Section

Turning to FIG. 8, in the embodiment shown a control section 70 coordinates the interaction of the various other components of the DC energy source monitor 10, including the driving of the display 40, the signaling to the calibration circuit 60, and the receipt of the output VCO-OUT from the VCO circuit 50, which output is indicative of the voltage of the battery being monitored, as well as the nominal voltage of the DC source being monitored. The control section 70 is preferably driven by a programmable control device, such as a microcontroller, a microcomputer, or a microprocessor circuit. The programmable control device preferably includes random access memory (RAM), read only memory (ROM), a computation component configured to perform mathematical calculations, and a counter configured to count pulses. A series of machine executable steps can be stored in the ROM or can be loaded into RAM from an external source for execution by the programmable control device. In the DC energy source monitor application described herein, a microcontroller is sufficient to provide the minimum control functions, and a more complex microprocessor or microcomputer is typically not justified. The discussion below will assume that a PIC12C5XX microcontroller is used as the programmable control device in the control section 70.

Figure 6:
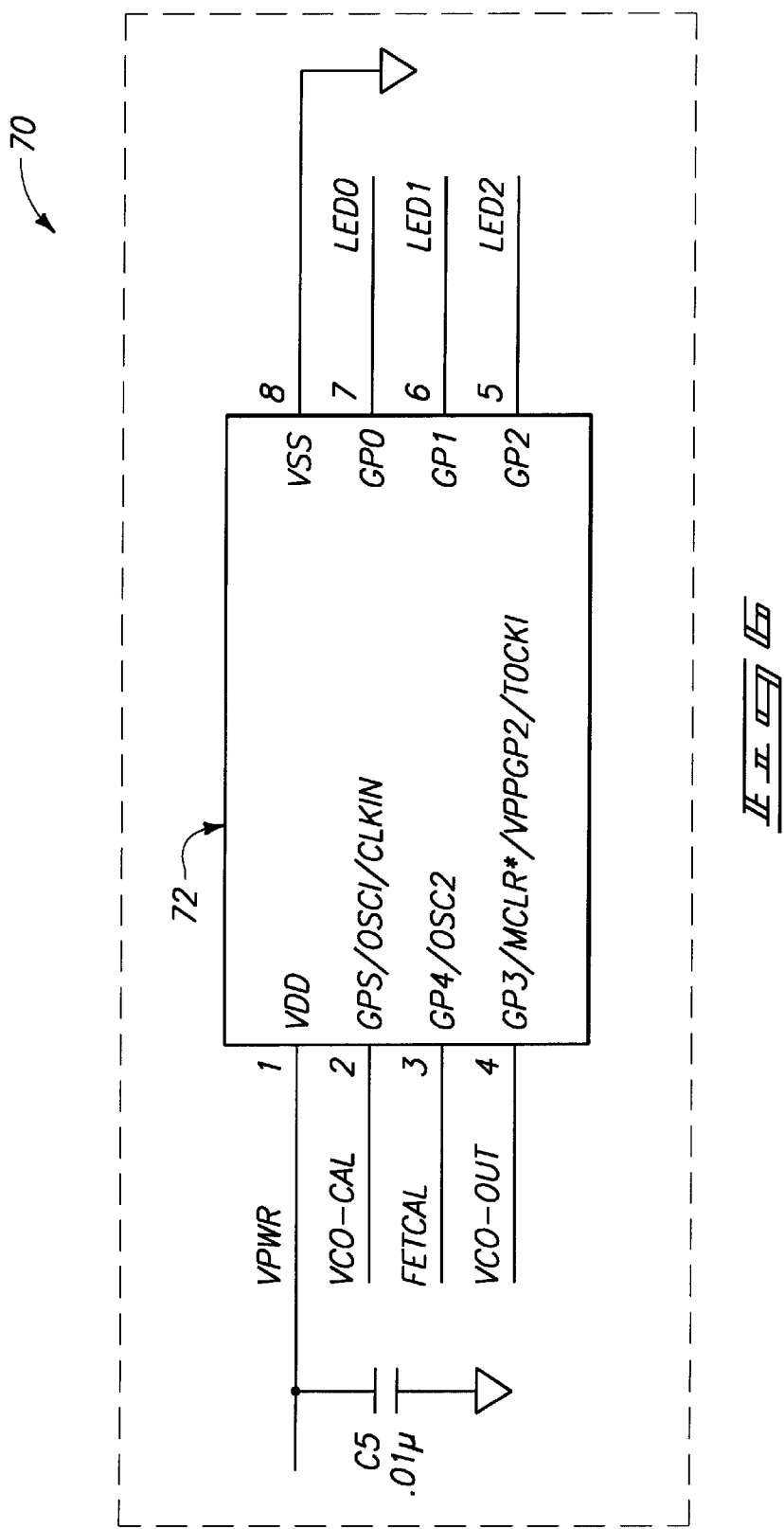
FIG. 6 is a schematic circuit diagram showing a control section circuit which can be used in the present invention.

Turning to FIG. 6, a schematic diagram showing the connections to the microcontroller 72 of the control section 70 is shown. The microcontroller 72 receives as an input the square wave output VCO_OUT of the VCO circuit 50, as shown in FIG. 8. Using internal timers in the VCO circuit 50, such as capacitor C2 of FIG. 4, the number of edges in a predetermined time frame are counted by the microcontroller and the result is stored in the microcontroller as a the value 'y'. In one embodiment the predetermined time frame is 65.536 milliseconds.

The control section 70 is configured to determine the transfer function of the VCO section 50. In one embodiment, this is accomplished by using the two calibration voltages from the VCO calibration section 60, as described above. Once the transfer function has been established, the microcontroller 72 can then determine overall system input voltage INPUT, and can then generate a digital output to the display section to display the correct LEDs to indicate the relative percent of charge and the nominal source voltage, as described above.

The general calculations to be performed by the microcontroller 72 to achieve the calibration of the VCO section 50 as shown and described more fully below. In operation, the control unit 70 periodically recalibrates the VCO section 50 via the calibration unit 60 by reading new y1 and y2 values, as will be more fully described below. These y1 and y2 values are used to determine new values for the coefficients m and b for the equations shown below. Note that the constants 'c' and 'x1' are fixed in software, as for example by storing them in the microcontroller ROM. With the periodically recalibrated m and b values, the controller 72 simply reads a new y3 value, processes it using equation (7) below, and obtains a value for x3, and uses x3 to set the appropriate LEDs to indicate system input INPUT.

The calculations to be performed by the microcontroller 72 will now be shown and described.

Recall that the output of the VCO circuit 50 is linear and of the form y=m*x+b, where x is the input voltage VCO-IN, and y is the output frequency VCO-OUT. The coefficients m and b can become unstable over time, and therefore are preferably recalculated periodically to maintain an accurate output y from the VCO circuit 50.

We start with the following equations:

$$y1 = m \cdot x1 + b \quad Y1 \rightarrow FETCAL = 0 \quad \text{(Eqn 1)}$$

$$y2 = m \cdot x2 + b \quad Y2 \rightarrow FETCAL = 1 \quad \text{(Eqn 2)}$$

To solve for m, subtract Eqn 2 from Eqn 1, i.e., (y1=m·x1+b)−(y2=m·x2+b). Solving for m, we get $$m = -(y1-y2)/(-x1+x2) \quad \text{(Eqn A)}$$

As described above in the for the calibration section 60, outputs VCO-IN of the calibration circuit, which are the inputs x1 and x2 to the VCO circuit 50, are predetermined constants from circuit analysis, and are thus known. The values y1 and y2, the output frequency of the VCO section 50, are read by the microcontroller 72, and are thus also known. Thus, the quantity (−x1+x2) in Eqn. A is a constant, which we will call "c", i.e.:

$$c = x2 - x1 \quad \text{(Eqn. 3)}$$

Thus, Eqn. A simplifies to $$m = (y2-y1)/c. \quad \text{(Eqn. 4)}$$

Solving Eqn. 1 for b, we see that $$b = y1 - m \cdot x1 \quad \text{(Eqn. 5)}$$

Now that the transfer function y=m*x+b of the VCO section 50 is characterized in terms of two input voltages x1 and x2, we can determine an arbitrary input voltage x3 given its corresponding output y3. That is, if we know an input voltage VCO-IN of x3 to the VCO circuit 50, we can calculate the output voltage measure VCO-OUT of y3 by the formula $$y3 = m \cdot x3 + b \quad \text{(Eqn. 6)}$$

Solving Eqn. 6 for x3, we get $$x3 = (y3-b)/m \quad \text{(Eqn. 7)}$$

The microcontroller is thus programmed with a set of machine executable steps to calculate m, b and x3 given the known or measured values for y2, y1, x2, x1 and c.

Machine Executable Steps

Figure 7:
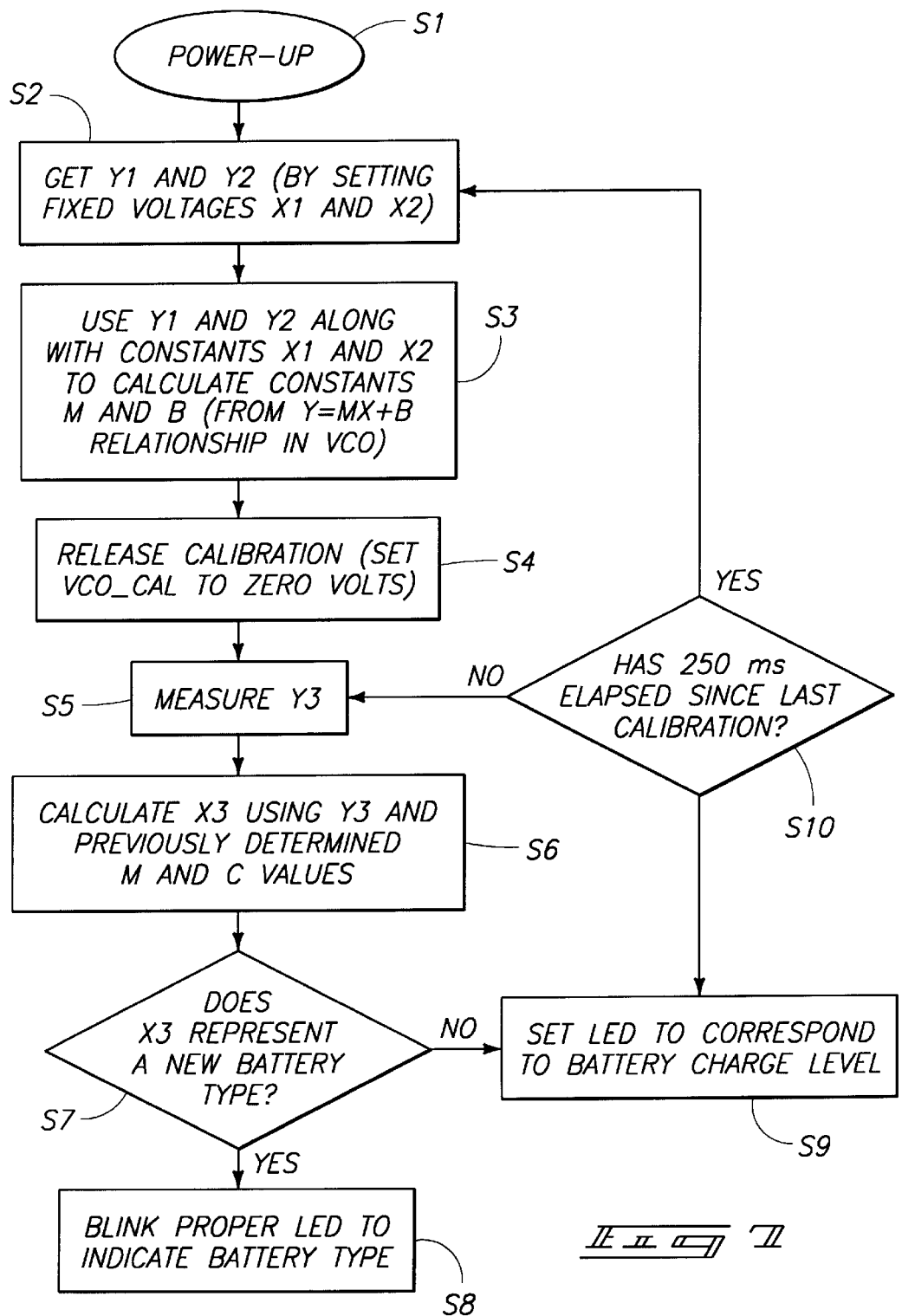
FIG. 7 is a flow chart showing the logic of a control scheme which can be used in the present invention.

As described above, the programmable control device 72 of FIG. 6 can be provided with a set of machine executable steps (i.e., a program) to perform the calculations described in the previous section. Turning to FIG. 7, an exemplary flow chart diagram of one such set of computer executable steps is shown.

Turning now to FIG. 7, the voltage monitor of the present invention is powered-up in step S1 by connecting it to a power source, such as the power supply 30 of FIG. 2. In step S2, the values of y1 and y2 (VCO-OUT of the VCO circuit 50) are generated by the VCO circuit 50 by providing known inputs VCO-IN of x1 and x2 to the VCO circuit from the from the calibration section 60 in the manner described above. In step S3, y1, y2, x1 and x2 are used to calculate values for m and b using Eqns. 3 and 4.

In step S4, the calibration circuit 60 is put off-line, and input VCO-CAL from the microcontroller 72 to the calibration circuit 60 is set to logical zero (i.e., to zero volts). Thereafter, in step S5, a VCO-OUT signal y3 from the VCO section 50 is measured by the microcontroller 72. Signal y3 is generated by applying the input INPUT from the DC source being monitored to the calibration section 60 to generate VCO-IN of x3, which in turn generates VCO-OUT signal y3 in the VCO section 50. Then, in step S6, x3 is calculated using the measured value of y3 and the previously determined values of m and b from step S3.

Following calculation of x3 in step S6, in step S7 the microcontroller determines whether x3 represents a new DC energy source type (i.e., does it fall outside of a predetermined range of voltages associated with the nominal voltage of a DC source immediately previously detected by the monitor, if any). If x3 does not represent a new DC source type, then in step S9 the microcontroller causes the display to indicate the relative level of charge of the DC source. If a new nominal voltage is represented by x3 in step S7, then the microcontroller causes the display to indicate the DC source type (nominal voltage), and processing is resumed at step S1.

If no new source type is indicated by x3 in step S7, then after displaying the source relative charge level in step S9, the program continues to step S10, In step S10, the microcontroller determines if 250 milliseconds has elapsed since the last calibration, using a clock, preferably an internal clock, to monitor the passage of time. If 250 ms has not elapsed since the last calibration, the program proceeds to step S5, and the VCO circuit output VCO-OUT is measured, and processing continues from step S5 as described. If 250 ms or more has elapsed since the last calibration as measured in step S10, then the microcontroller returns to step S2 to generate known voltages to the calibration section, so that values of m and b can be recalculated in the manner described.

The programmable control device 72 of the monitor 10 is further provided with a look-up table of voltages appropriate to the range of voltages anticipated to be encountered by the monitor. For example, for a energy source monitor intended to monitor batteries having nominal voltages of A, B and C, a table is provided indicating that the range of voltages (lowest to highest) of A is from A1 to A2, the range of voltages of B is from B1 to B2, and the range of voltages of C is from C1 to C2 wherein A2<B1, and B2<C1 . If a voltage is detected between A1 and A2, then the microcontroller determines from the look-up table that the source has a nominal voltage of A, and signals this to the display. Further, if the microcontroller measures the voltage as A3, then the microcontroller determines the battery charge from a look-up table.

The look-up table of threshold values (i.e., when the battery is deemed to pass from one remaining life level to another, for example, the point at which the monitor indicates life has passed from the "50%" level to the "25%" level) can either be set in the ROM of the microcontroller, or can be set by a user of the monitor. Similarly, the points at which a source is considered to become a different nominal source can be set in ROM or can be set by a user of the monitor. Likewise, state-of-health parameters can either be set in ROM or user-defined in the manner described below. For example, the point where the microcontroller specifically switches from an indication of 75% to an indication of 100% can be at 12.1v or programmed later to be at 12.23v. In another example, the specific DC sources being monitored can be set initially as 6v, 12v, 24v, 36v, and 48v batteries, but later reprogrammed for 6v, 12v, 24v, 32v, and 48v batteries.

Figure 9:
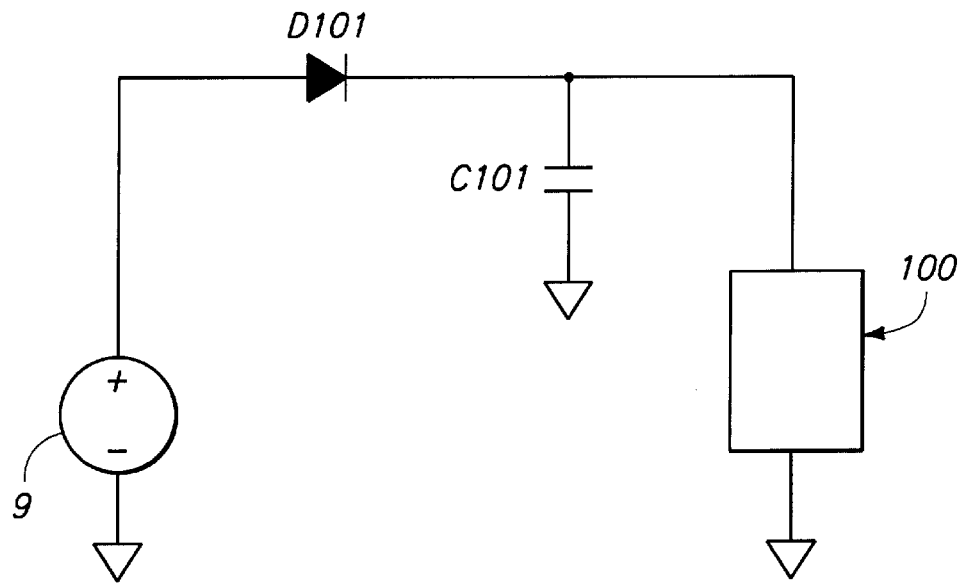
FIG. 9 is a schematic circuit diagram showing a prior art DC energy source monitor.

Turning to FIG. 9, a circuit schematic of a prior art battery monitor 100 is shown. V1 represents the battery being monitored by the monitor 100, while diode D101 provides reverse battery protection and capacitor C101 provides power supply filtering. The thresholds at which the monitor determines that the life of the battery has passed from one stage to another are set in ROM of the microcontroller.

Figure 10:
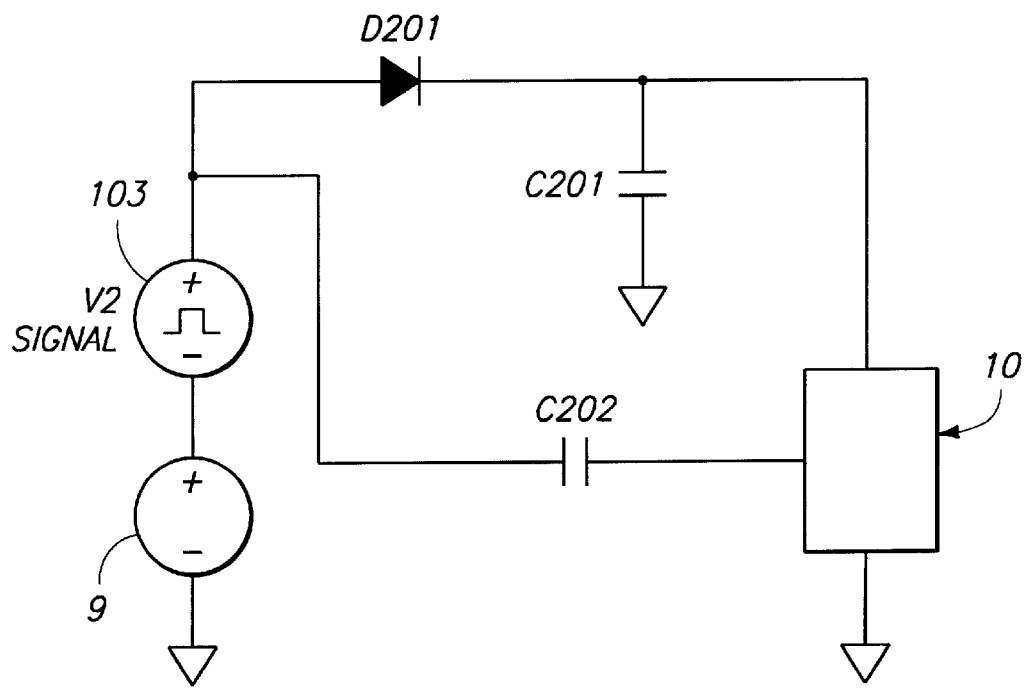
FIG. 10 is a schematic circuit diagram showing a circuit which can be used to change the threshold levels of relative charge as detected by the DC energy source monitor.
Figure 11:
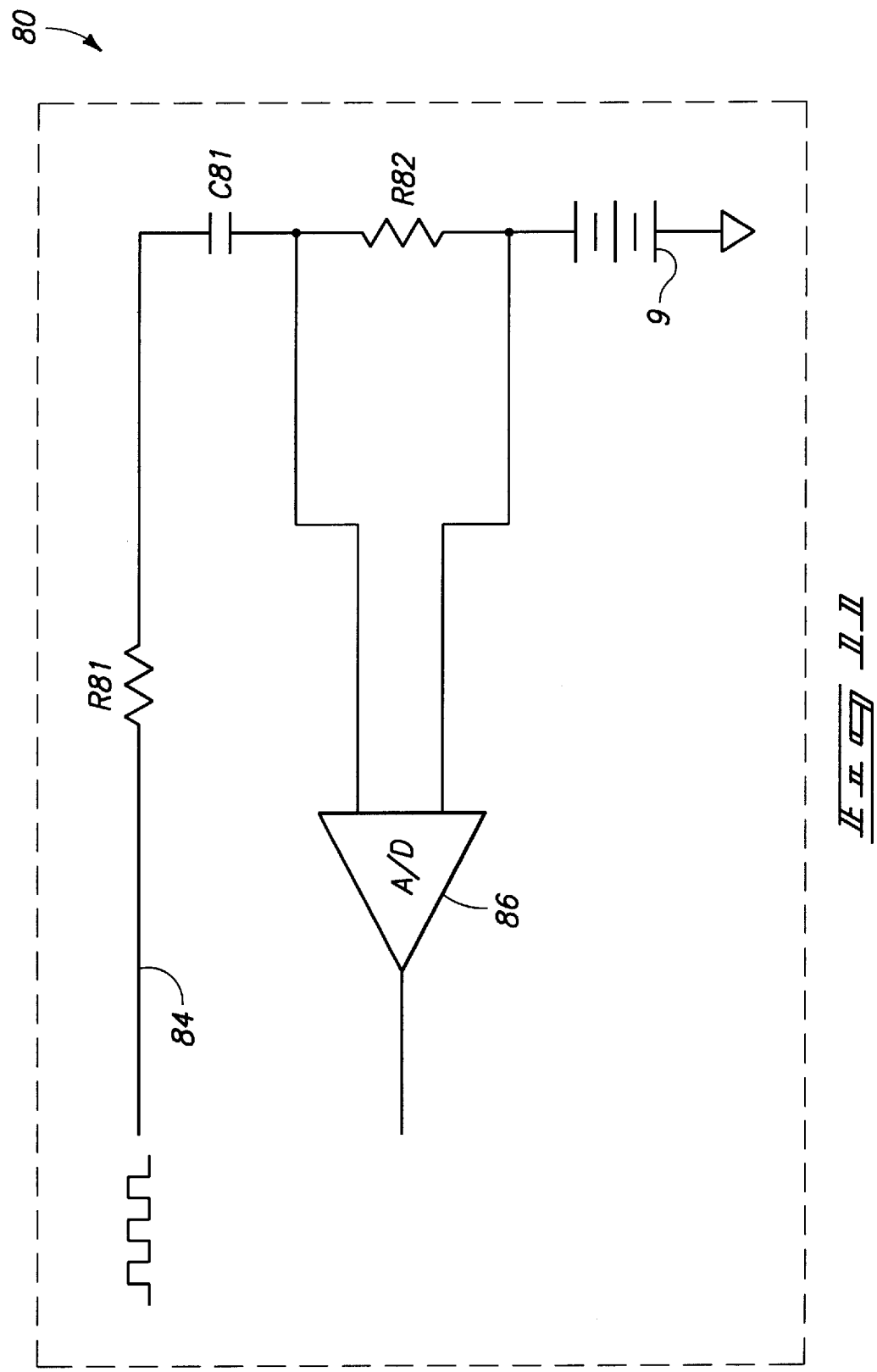
FIG. 11 is a schematic circuit diagram of a circuit which can be used with the monitor of the present invention to also monitor conductance of a DC energy source.

Turning to FIG. 10, a schematic circuit diagram is shown which allows a user of the monitor of the present invention to reprogram the threshold values in the manner described above. In the circuit of FIG. 10, a serial communication stream to send signals to the microcontroller to change threshold levels has been added. A DC blocking capacitor C202 is attached to an input port on the microcontroller in the monitor 10. Source V2 is shown as an AC source which is added in series with a fixed DC voltage source 9. Diode D201 and capacitor C201 serve as a low pass filter to prevent the AC component from being seen by the power supply circuitry of the monitor 10. Capacitor C202 acts to block the DC power supply voltage from source 9 thus only the signal with which is intended to be communicate to the microcontroller is actually present at the input port. This provides a one way communication path to the microcontroller in the monitor 10. Using this communication path, or serial communication stream, the microcontroller can be reprogrammed to adjust the thresholds values at which nominal voltages, percents of relative charge, and/or state-of health parameters will be indicated by the display.

Source State-of-Health Monitor Module

Referring to FIG. 8, a source "state of health" module 80 can be provided to the monitor 10 of the present invention. A typical parameter of the state of health of the source to be monitored is the conductance of the source. In addition, state-of-health can be indicated by the capability of the source to accept instantaneous current supply, the age of the source, and the charge capacity of the source, which can also be monitored. In FIG. 8, capacitor C81 is used to provide direct current rejection, and resistor R82 acts as a current shunt. An alternating current signal 84 is provided to the conductance module 80, and the responsive signal is provided to the A/D converter 86 which provides a digital output signal indicative of the conductance of the source. The output of A/D converter 86 is provided to the microcontroller. The difference between the signal for the A/D converter 86 and the A/C input 84 is indicative of the conductance of the source, and can be compared to a look-up table stored into the microcontroller to determine the relative conductance of the source as compared to a "healthy" source of equivalent nominal voltage. The microcontroller module 70 of FIG. 8 can then display the result via display module 40.

In addition, the microcontroller can be programmed with a series of machine executable steps to use the measured conductance of the source to calculate the capability of the source to accept instantaneous current, the age of the source, and the charge capacity of the source. These calculated values can then be compared to other look-up tables stored into the microcontroller to determine their relative values as compared to preselected values indicative of a "healthy" source of equivalent nominal voltage.

The Method

The invention further includes a method for determining a nominal voltage of a battery. Using the charge on the battery. The method includes providing a programmable control device having stored ranges of numbers, each range corresponding to an associated nominal battery voltage. The programmable control device further includes a series of machine executable steps for comparing a received signal to the stored ranges of numbers to identify an associated nominal battery voltage. The charge on the battery is measured, and a signal is generated using the measured charge. The signal is then provided to the programmable control device. The programmable control device uses the signal to identify the associated nominal voltage based on the stored ranges of numbers, and provides an output indicative of the nominal voltage of the battery.

The method further includes the step of using a voltage controlled oscillator to generate the signal which is provided to the programmable control device. The method can further include the step of periodically calibrating the voltage controlled oscillator ("VCO") to account for variations over time and between oscillators. Preferably the calibration is done automatically. One method of periodic automated calibration is to have the programmable control device (generate a periodic, known signal. This signal is then provided to the VCO, and the resulting output from the VCO is measured and compared with the known signal generated by the control device. The control device can then provide a calibration signal. The signal can be provided to the VCO, or it can be provided internally to the control device in the series of machine executable steps which are provided to allow the control device to calculate the battery charge from the signal.

More preferably, where the calculation of the VCO is performed by a transfer function within the programmable controller, the programmable controller is configured to generate as many known, periodic signals of different values as there are variables in the transfer function. For example, where the transfer function is based on the equation y=mx+b, and x is an input signal to the VCO and y is the output from the VCO, the coefficients m and b are considered to be the variables which need to be determined for calibration of the VCO. Therefore, two signals for x are generated, and the corresponding y values are used to solve the two equation problem y1=m·x1+b, and y2=m·x2+b.

While the above invention has been described with particularity to specific embodiments and examples thereof, it is understood that the invention comprises the general novel concepts disclosed by the disclosure provided herein, as well as those specific embodiments and examples.

We claim:

1. A multiple nominal voltage direct current energy source monitor, comprising:
    an analog-to-digital converter configured to measure voltage from a direct current energy source being monitored by the voltage monitor and generate a digital output corresponding thereto; and
    a programmable control device configured to receive the digital output from the analog-to-digital converter and to look up a nominal voltage from a range of nominal voltages anticipated to be encountered by the direct current energy source monitor, the nominal voltage corresponding to the digital output, and further configured to calculate a relative charge of the direct current energy source as compared to a full charge on the direct current energy source.

2. The multiple nominal voltage direct current energy source monitor of claim 1 further comprising a display in communication with the programmable control device and configured to display at least one of the nominal direct current energy source voltage or the relative charge of the direct current energy source.

3. The multiple nominal voltage direct current energy source monitor of claim 1 further comprising a voltage controlled oscillator configured to receive the voltage of the direct current energy source being monitored and generate a frequency output proportional to the received voltage, and further wherein the programmable control device is configured to use the frequency output to determine the received voltage from the direct current energy source.

4. The multiple nominal voltage direct current energy source monitor of claim 3 wherein the voltage controlled oscillator is comprised of precision circuit components.

5. The multiple nominal voltage direct current energy source monitor of claim 3 further comprising a calibration circuit configured to periodically calibrate the voltage controlled oscillator.

6. The multiple nominal voltage direct current energy source monitor of claim 3 wherein the voltage controlled oscillator comprises a first op-amp configured to receive the voltage of the direct current energy source being monitored and generate an output in response thereto, a second op-amp configured to receive the output from the first op-amp and generate a second output in response thereto, the second output being the frequency output proportional to the received voltage.

7. The multiple nominal voltage direct current energy source monitor of claim 6 wherein voltage controlled oscillator further comprises a resistor array forming feedback elements to the first and second op-amps.

8. The multiple nominal voltage direct current energy source monitor of claim 5 wherein the calibration circuit is configured to receive a first predetermined voltage from the programmable control device and generate a first predetermined output in response thereto, and wherein the voltage controlled oscillator is further configured to receive the first predetermined output and generate a first output frequency in response thereto.

9. The multiple nominal voltage direct current energy source monitor of claim 8 wherein the voltage controlled oscillator (VCO) is comprised of VCO circuit components, wherein the generation of the output frequency by the voltage controlled oscillator is governed by the transform function y=mx+b, and wherein y indicates the frequency output of the voltage controlled oscillator, x indicates the input to the voltage controlled oscillator, and m and b are coefficients particular to the VCO circuit components, and wherein the programmable control device is further configured to use the first predetermined voltage and the first output frequency to calculate the coefficients m and b.

10. The multiple nominal voltage direct current energy source monitor of claim 9 wherein the calibration circuit is configured to receive a second predetermined voltage from the programmable control device and generate a second predetermined output in response thereto, and wherein the voltage controlled oscillator is further configured to receive the second predetermined output and generate a second output frequency in response thereto.

11. The multiple nominal voltage direct current energy source monitor of claim 10 wherein the programmable control device is further configured to use the second predetermined voltage and the second output in response thereto to calculate the coefficients m and b.

12. The multiple nominal voltage direct current energy source monitor of claim 11 wherein the programmable control device is configured to periodically generate the first and second predetermined voltages to cause the voltage controlled oscillator to generate the first and second output frequencies in response thereto.

13. The multiple nominal voltage direct current energy source monitor of claim 12 wherein the programmable control device is further configured to use the calculated values for coefficients m and b to calibrate the output of the voltage controlled oscillator according to the equation y=mx+b, and further wherein the programmable control device is further configured to use the calculated values of m and b to determine the voltage detected by the voltage controlled oscillator from the direct current energy source to calculate the voltage of the direct current energy source.

14. The multiple nominal voltage direct current energy source monitor of claim 1 wherein the programmable control device is provided with a look-up table of voltages corresponding to nominal voltages expected to be encountered by the direct current energy source voltage monitor, and to indicate which of the nominal voltages corresponds to the detected voltage of the direct current energy source.

15. The multiple nominal voltage direct current energy source monitor of claim 14 wherein the programmable control device is provided with a look-up table of threshold voltages corresponding to defined direct current energy source charge amounts.

16. The multiple nominal voltage direct current energy source monitor of claim 15 wherein the threshold voltages in at least the look-up table of voltages corresponding to nominal voltages expected to be encountered by the direct current energy source voltage monitor or the look-up table of threshold voltages corresponding to defined direct current energy source charge amounts can be set by a user of the direct current energy source voltage monitor.

17. The multiple nominal voltage direct current energy source monitor of claim 8 wherein the programmable control device comprises random access memory (RAM), read only memory (ROM), a computation component configured to perform mathematical calculations, and a counter configured to count pulses.

18. A multiple nominal voltage direct current energy source conductance monitor for monitoring a direct current energy source, comprising:

an analog-to-digital converter configured to measure conductance of a direct current energy source being monitored by the conductance monitor and generate a digital output signal corresponding thereto; and a programmable control device configured to received the digital output signal from the analog-to-digital converter and to look up a nominal conductance from a range of nominal conductances anticipated to be encountered by the direct current energy source conductance monitor, the nominal conductance corresponding to the digital output signal, and further configured to calculate a relative state-of-health of the direct current energy source relating to at least one of age, charge capacity, or capability for instantaneous current supply of the direct current energy source as compared to a nominal direct current energy source.

19. The multiple nominal voltage direct current energy source conductance monitor of claim 18 further comprising a display in communication with the programmable control device, the display configured to display the nominal direct current energy source conductance.

20. The multiple nominal voltage direct current energy source conductance monitor of claim 18 further comprising a display in communication with the programmable control device, the display being to display the relative state-of-health of the direct current energy source.

21. The multiple nominal voltage direct current energy source conductance monitor of claim 18 further comprising a dynamic conductance measurement circuit.

22. The multiple nominal voltage direct current energy source conductance monitor of claim 18 further comprising a small-signal alternating current generator and a small-signal alternating current measurement circuit.

23. Method for determining a nominal voltage of a direct current energy source having a charge, comprising:

providing a programmable control device having stored ranges of numbers, each range corresponding to an associated nominal direct current energy source voltage anticipated to be encountered, the programmable control device further including a series of machine executable steps for comparing a received signal to the stored ranges of numbers to identify an associated nominal direct current energy source voltage;

measuring the charge on the direct current energy source;

generating a signal based on the charge measured on the direct current energy source;

providing the signal to the programmable control device;

looking up from the stored ranges of numbers a nominal direct current energy source voltage which is associated with the signal; and receiving an output from the programmable control device indicative of the nominal voltage of the direct current energy source.

24. The method of claim 23 further comprising providing a voltage controlled oscillator to generate the signal.

25. The method of claim 24 further comprising periodically calibrating the voltage controlled oscillator.

26. The method of claim 25 further comprising automatically calibrating the voltage controlled oscillator by causing the programmable control device generate a first, periodic known signal, providing the first, periodic known a signal to the voltage controlled oscillator, and using the signal generated by the voltage controlled oscillator in response thereto to calibrate the voltage controlled oscillator.

27. In the method of claim 23 wherein the programmable control device is further provided with a set of values within each range of numbers, each set of values being indicative of the amount of charge on the direct current energy source for the nominal direct current energy source voltage associated with the range of numbers, and wherein the programmable control device is further provided with a series of machine executable steps for comparing the signal to the set of values within the range of numbers ranges corresponding to the identified associated nominal direct current energy source voltage to identify relative charge on the direct current energy source, and wherein the method further comprises receiving a second output provided from the programmable control device indicative of the relative charge on the direct current energy source.

* * * * *